United States Patent [19]

Fleischer et al.

[11] 4,315,227

[45] Feb. 9, 1982

[54] GENERALIZED SWITCHED-CAPACITOR ACTIVE FILTER

[75] Inventors: Paul E. Fleischer, Little Silver, N.J.; Kenneth R. Laker, Staten Island, N.Y.

[73] Assignee: Bell Telephone Laboratories, Incorporated, Murray Hill, N.J.

[21] Appl. No.: 100,293

[22] Filed: Dec. 5, 1979

[51] Int. Cl.³ .................... H03H 19/00; H03K 5/153
[52] U.S. Cl. .................................. 333/173; 328/151; 333/174
[58] Field of Search ............... 333/17 R, 18, 173, 174, 333/167; 328/150–151, 167; 307/240–246, 295, 231, 520, 521; 330/69, 85, 90, 291, 293, 303

[56] References Cited

PUBLICATIONS

Martin–"Improved Circuits for the Realization of Switched Capacitor Filters", Proc. of 1979 ISCAS, 1979; pp. 756–759.

White et al.–"A Monolithic Dual-Tone Multifrequency Receiver", Session II: Telecommunication Circuit Techniques, 1979, IEEE International Solid–State Circuits Conference, Feb. 14, 1979, (Pennsylvania Ballroom); pp. 36–37.

Martin et al.–"Strays-Insensitive Switched–Capacitor Filters Based on Bilinear Z–Transform", Electronic Letters, vol. 15, No. 13, Jun. 21, 1979; pp. 365–366.

*Primary Examiner*—Marvin L. Nussbaum
*Attorney, Agent, or Firm*—Sylvan Sherman; Volker R. Ulbrich

[57] ABSTRACT

Because of the very large variety of useful filter configurations, it is highly desirable to have a generalized circuit topology from which all specific filters can be derived. A generalized switched-capacitor biquadratic active filter comprises a pair of operational amplifiers (10, 11), each of which has an unswitched feedback capacitor (D, B) connected between its output port (3, 3') and its inverting input port (1, 1'). A third through-switched capacitor (C) provides feedback between the output port (3') of the second amplifier (11) and the inverting input port (1) of the first amplifier (10). A diagonally-switched capacitor (A) couples the output port (3) of the first amplifier (10) to the inverting input port (1') of the second amplifier (11). The noninverting input ports (2, 2') of the two amplifiers are connected to signal ground. The filter input terminal (5) is connected to the inverting input ports (1, 1') of each amplifier by an input circuit including a parallel array of an unswitched capacitor, a diagonally-switched capacitor, and a through-switched capacitor (L, H, G and K, J, I). Damping is provided by either a through-switched capacitor (F) connected in parallel with feedback capacitor (B), or by a unswitched capacitor (E) connected in parallel with through switched feedback capacitor (C).

10 Claims, 4 Drawing Figures

GENERALIZED SWITCHED-CAPACITOR ACTIVE FILTER

TECHNICAL FIELD

This invention relates to switched-capacitor active filters and, in particular, to a generalized biquadratic filter building block.

BACKGROUND OF THE INVENTION

Active - RC biquads have played, and continue to play an important role in the realization of precision voice frequency filters. Because there are as many different filters as there are uses for them, it was found to be desirable to devise a universal "building block" from which specific filter configurations could readily be derived. This development resulted in the so-called "STAR" filter. (See, for example, "STAR: A Universal Active Filter" by J. J. Friend and W. Worobey, published in the September, 1979, *Bell Laboratories Record*, pp. 232–236.)

More recently, a new class of active filters, using switched-capacitors, has been developed which can provide much higher order filtering on a single MOS chip. To be commercially competitive, however, a universal filter topology, comparable to the generalized STAR filter configuration is most advantageous.

SUMMARY OF THE INVENTION

A generalized switched-capacitor biquadratic active filter topology, in accordance with the present invention, comprises a pair of operational amplifiers, each of which has an unswitched feedback capacitor connected between its output port and its inverting input port. A third, through-switched capacitor provides feedback between the output port of the second amplifier and the inverting input port of the first amplifier. A diagonally-switched capacitor couples the output port of the first amplifier to the inverting input port of the second amplifier. The noninverting ports of the two amplifiers are connected to signal ground.

The filter input terminal is connected to the inverting input port of each amplifier by an input circuit including a parallel array of an unswitched capacitor, a through-switched capacitor, and a diagonally-switched capacitor.

Damping is provided by either a through-switched capacitor connected between the output port of the second amplifier and its inverting input port, or by an unswitched capacitor connected between the output port of the second amplifier and the inverting input port of the first amplifier.

By the appropriate selection of capacitor values, this structure is capable of providing all the desirable biquadratic transfer functions. As such, a common integrated circuit layout can be constructed which can be readily customized in a later stage of the manufacturing process by simply changing the poly I and poly II masks.

DETAILED DESCRIPTION

Figure 1:
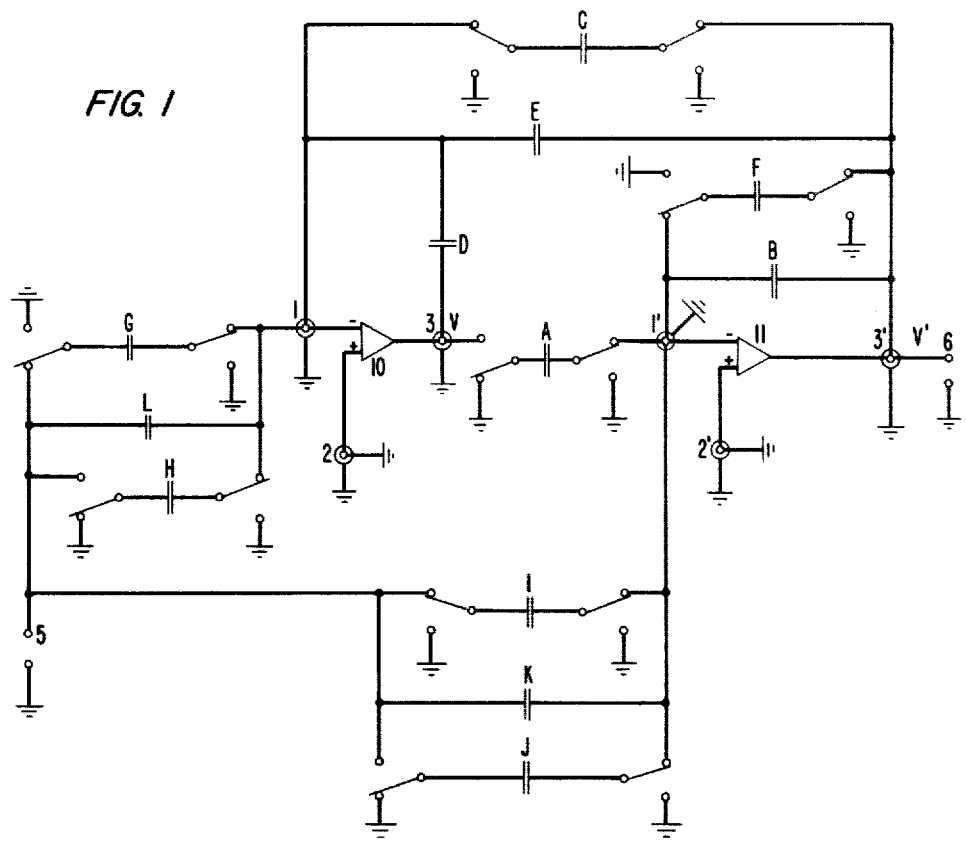
FIG. 1 shows a generalized switched-capacitor, active filter in accordance with the present invention.

Referring to the drawings, FIG. 1 shows the generalized switched-capacitor, active filter in accordance with the present invention comprising first and second operational amplifiers 10 and 11, and an array of un-switched-capacitors B, D, L, E and K; through-switched capacitors C, F, G and I; and diagonally-switched capacitors A, H and J. As used herein, the term "unswitched capacitor" shall be understood to refer to a capacitor that is permanently connected in the circuit. A "through-switched" capacitor shall be understood to refer to a switched-capacitor whose two terminals are simultaneously grounded during one of the switching phases. A "diagonally-switched" capacitor, on the other hand, shall be understood to refer to a switched capacitor whose terminals are alternately grounded during successive switching phases. Finally, all of the capacitors will be identified by letters A, B . . . which shall also refer to the magnitude of the respective capacitors. Thus, for example, the magnitude of capacitor A is A.

Referring again to FIG. 1, a first unswitched feedback capacitor D is connected between the output port 3 and the inverting input port 1 of amplifier 10. Similarly, a second unswitched feedback capacitor B is connected between the output port 3' and the inverting input port 1' of amplifier 11. A third through-switched capacitor C is connected between the output port 3' of amplifier 11 and the inverting input port 1 of amplifier 10. The two amplifiers are also connected by means of a diagonally-switched capacitor A which connects the output port 3 of amplifier 10 to the inverting input port 1' of amplifier 11. The noninverting input ports 2 and 2' of amplifiers 10 and 11 are connected to signal ground.

The filter input terminal 5 is coupled to the inverting input port 1 of amplifier 10 by means of a first input circuit comprising, in parallel, a through-switched capacitor G, an unswitched capacitor L, and a diagonally-switched capacitor H. Similarly, terminal 5 is coupled to the inverting input port 1' of amplifier 11 by means of a second input circuit comprising, in parallel, through-switched capacitor I, unswitched capacitor K, and diagonally-switched capacitor J.

Damping is provided by a through-switched capacitor F connected in parallel with feedback capacitor B, or by means of an unswitched capacitor E connected in parallel with feedback capacitor C.

The switches, illustrated in FIG. 1 as single-pole, double-throw, break-before-make switches, are shown in one of their two possible switched states. In operation, they are operated in synchronism under the control of a timing signal (not shown) which causes them to switch between their two switching states.

Figure 2:
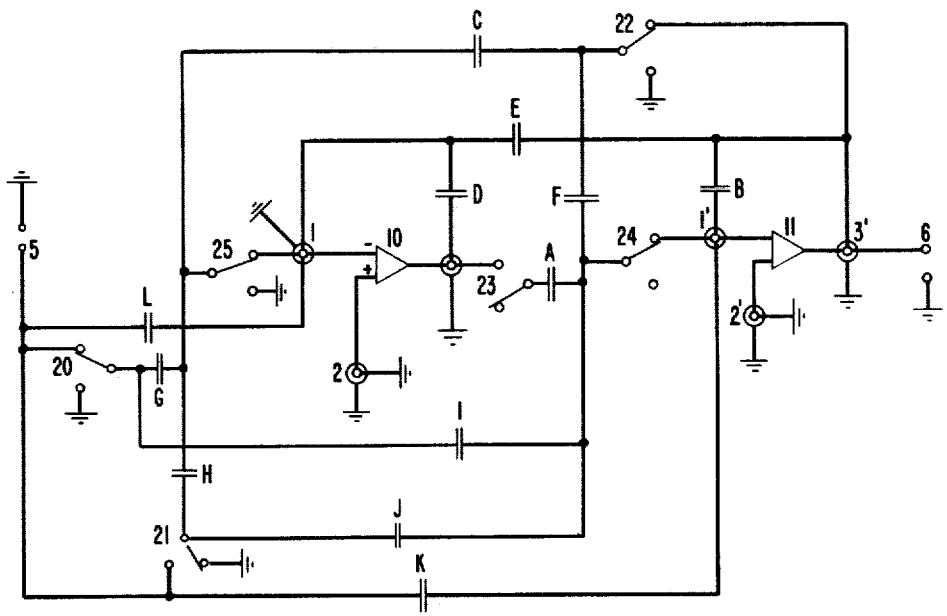
FIG. 2 is a modified embodiment of the filter shown in FIG. 1 wherein the number of switches has been minimized.

A careful inspection of FIG. 1 will show that there are groups of switches operating in identical fashion connected in parallel. Accordingly, it is possible to replace such groups with a single switch, thereby reducing the total number of switches in the filter. FIG. 2, now to be considered, is a modified embodiment of the generalized switched capacitor filter of FIG. 1 wherein the number of switches has been reduced to six, as compared to the fourteen employed in FIG. 1. As an example, it will be noted that one of the terminals of the capacitors I and G is alternately switched between filter input terminal 5 and ground. Accordingly, the two switches used for this purpose in the embodiment of FIG. 1 can be replaced by a single switch 20 in FIG. 2. Similarly, one of the terminals of the capacitors A, I and F is alternately switched between input port 1' of amplifier 11 and ground. Accordingly, this can be accomplished by means of a single switch 24 in the embodiment of FIG. 2, instead of the three switches used for this purpose in the embodiment of FIG. 1. Notwithstanding these and the other changes, it can readily be shown that the electrical behavior of the embodiment of FIG. 2 is identical to that of FIG. 1.

It can also be shown that the voltage transfer function, $T = V(out)/V(in)$, of the generalized circuit shown in FIG. 1 is biquadratic in the z-transform variable z. That is, $$T(z) = \frac{N(z)}{D(z)} = \frac{\gamma + \epsilon z^{-1} + dz^{-2}}{1 + \alpha z^{-1} + \beta z^{-2}} \tag{1}$$

From this generalized function, different transfer functions, such as low-pass (LP), band-pass (BP), high-pass (HP), and all-pass (AP), can be realized by the appropriate choice of the numerator coefficients.

In terms of the capacitor values, the desired transfer function $T_{56}$, between filter input terminal 5 and output terminal 6, is $$T_{56} = -\frac{D(I + K) + (AG + AL - DI - DJ - 2DK)z^{-1} + (DJ + DK - AH - AL)z^{-2}}{D(F + B) + (AC + AE - DF - 2BD)z^{-1} + (DB - AE)z^{-2}} \tag{2}$$

The transfer function $T_{53}$, between input terminal 5 and amplifier output port 3 is $$T_{53} = \frac{\begin{array}{c}(IC + IE + KC + KE - GF - GB - LF - LB) + \\ (FH + BH + BG + FL + 2BL - JC - JE - IE - KC - 2KE)z^{-1} + \\ (EJ + EK - BH - BL)z^{-2}\end{array}}{D(F + B) + (AC + AE - DF - 2BD)z^{-1} + (DB - AE)z^{-2}} \tag{3}$$

Before undertaking further analysis, some extraneous degrees of freedom can be eliminated. First, A is made equal to B. It can be shown that the net effect of this choice is to remove the ability to control simultaneously the gain constants associated with both $T_{56}$ and $T_{53}$. However, through scaling techniques, this degree of freedom can later be restored to the circuit. Secondly, it can be shown that the two groups of capacitors (C, D, E, G, H, L) and (A, B, F, I, J, K) may each be arbitrarily and independently scaled without changing the transfer function. Accordingly, B and D are arbitrarily chosen equal to one. Thus, we have $$A = B = D = 1 \tag{4}$$

Figure 3:
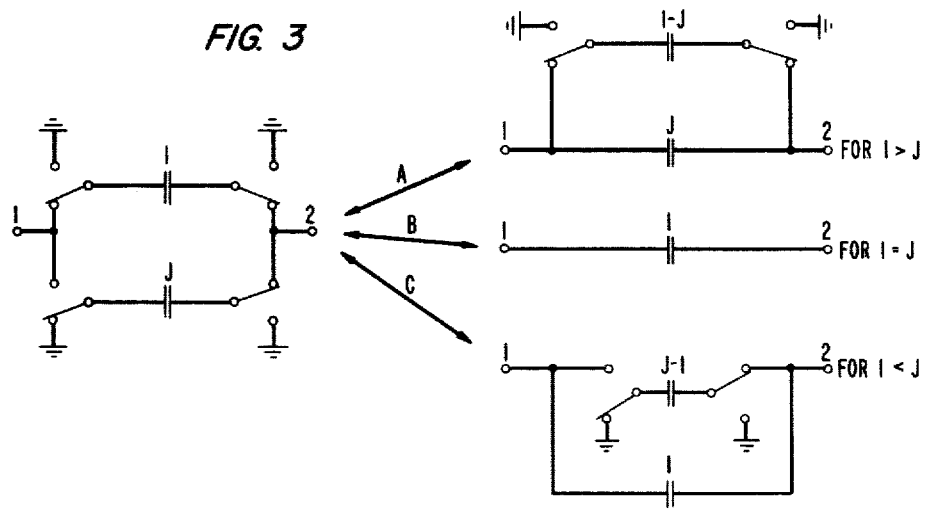
FIG. 3 shows the various equivalences of the parallel-combination of a through-switched capacitor and a diagonally-switched capacitor having different relative values.

Finally, it can be shown that the inclusion of fixed capacitors L and K in the input circuits is redundant. As FIG. 3 illustrates, it is sufficient to specify only the two pairs of switched capacitors, i.e., G, H and I, J, respectively. Depending upon the relative sizes of these pairs of capacitors, they can be realized by an unswitched capacitor equal to the smaller of the two and a switched capacitor equal to the difference of the two. In the special case of $I = J$, they can be replaced by a single unswitched capacitor. Thus, L and K can be made equal to zero for purposes of analysis. This equivalence can be shown to be correct when one end of the capacitor array is connected to a voltage source (e.g., an op amp output port), whose voltage remains constant over a full switching cycle, and the other end is connected to a virtual ground (e.g., an inverting op amp input port).

Having made these substitutions, equations (2) and (3) reduce to $$T_{56} = -\frac{1 + (G - I - J)z^{-1} + (J - H)z^{-2}}{(F + 1) + (C + E - F - 2)z^{-1}(1 - E)z^{-2}} \text{ and} \tag{5}$$

$$T_{53} = \frac{(IC + IE - FG - G) + (FH + H + G - JC - JE - IE)z^{-1} + (EJ - H)z^{-2}}{(F + 1) + (C + E - F - 2)z^{-1} + (1 - E)z^{-2}} \tag{6}$$

It will be noted the poles of the transfer function given by equation (5) are determined by C, E and F, while the zeros are determined by G, H, I and J. It is also apparent that the three numerator coefficients are fully adjustable, thus permitting arbitrary zeros to be realized. It may also be shown that arbitrary, stable poles can be realized by proper choice of C, E, and F.

With regard to equation (6), it is noted that it has the same poles as equation (5). The zeros, however, are formed in a more complicated fashion. Nevertheless, there are cases where $T_{53}$ provides a more economical realization of a given transfer function than $T_{56}$.

One further simplification can be made involving capacitors E and F. These are redundant elements in the sense that both provide damping. Consequently, both need not be included in the same circuit. It is, therefore, convenient to define an "E - circuit" in which $E \neq 0$ and $F = 0$, and a "F - circuit" in which $E = 0$ and $F \neq 0$. The transfer functions can then be given for each class of circuit as follows:

$$T_{56E} = -\frac{1 + (G - I - J)z^{-1} + (J - H)z^{-2}}{1 + (C + E - 2)z^{-1} + (1 - E)z^{-2}}, \tag{7}$$

$$T_{53E} = \frac{(IC + IE - G) + (H + G - JC - JE - IE)z^{-1} + (EJ - H)z^{-2}}{1 + (C + E - 2)z^{-1} + (1 - E)z^{-2}} \tag{8}$$

and $$T_{56F} = -\frac{1 + (G - I - J)z^{-1} + (J - H)z^{-2}}{(F + 1) + (C - F - 2)z^{-1} + z^{-2}}, \tag{9}$$

$$T_{53F} = -\frac{(GF + G - IC) + (JC - FH - H - G)z^{-1} + Hz^{-2}}{(F + 1) + (C - F - 2)z^{-1} + z^{-2}} \quad (10)$$

An examination of these two classes of transfer functions discloses that the numerators of $T_{56E}$ and $T_{56F}$ are identical while the numerators of $T_{53E}$ and $T_{53F}$ are quite different. Thus, for a given requirement, in which the desired output voltage is V' at amplifier output port 3', the transfer functions $T_{53E}$ and $T_{53F}$, and the corresponding unscaled voltage V at amplifier output port 3 may be quite different for the two networks. An analogous situation is obtained if the desired output is V at amplifier output port 3. These differences will ultimately affect the final scaled capacitor values and the total capacitance required to realize any particular circuit. It also will determine which of the two classes of circuits is preferred in a particular case.

It should be pointed out that the relative phasings of the through-switched and the diagonally-switched capacitors shown in FIG. 1 are not necessarily unique. In many cases, the same transfer function can be obtained by different relative phasings of some of the switched capacitors. There are, in fact, too many possibilities for a detailed consideration.

DESIGN PROCEDURE

The synthesis of the biquad begins with a statement of the desired biquadratic filter characteristic. This is then expressed as either an s-domain transfer function or a z-domain transfer function. If expressed as an s-domain function, the desired z-domain function is readily obtained using one of the transformation equations such as, for example, the bilinear transformation $$s = \frac{2}{\tau} \cdot \frac{1 - z^{-1}}{1 + z^{-1}}, \quad (11)$$

where $\tau$ is the full switching period. The resulting z-domain transfer function will have the form given by equation (1).

The first step in the design is to determine the capacitors C and E or F which determine the transfer function poles which are the zeros of the transfer function denominator D(z). The pole placement design equations for the $T_{56E}$ and $T_{53E}$ transfer functions are $$E = 1 - \beta \quad (12a)$$

and $$C = 1 + \beta + \alpha \quad (12b)$$

Similarly, the pole placement design equations for the $T_{56F}$ and $T_{53F}$ transfer functions are $$F = \frac{1 - \beta}{\beta} \quad (13a)$$

and $$C = \frac{1 + \beta + \alpha}{\beta}. \quad (13b)$$

Once C and E or F have been determined according to equations (12) or (13), the capacitors G, H, I and J are computed to obtain the transfer function zeros. This is done by matching the coefficients of the numerators of (7), (8), (9), or (10) to the desired z-domain transfer function numerator. (This is done for various generic transfer functions in the tables given hereinbelow.)

Once the basic design is obtained, the next step consists of scaling the capacitors to adjust the dynamic range at the output of the other op amp. It is then convenient to rescale the capacitors in each of the two stages to obtain a minimum capacitance value of 1 unit in each stage. The actual minimum value of capacitance which will be realized depends on the technology, the desired precision of the transfer function, and the estimated effects of parasitics.

Table I is a listing of generic biquadratic transform functions for various low-pass (LP), band-pass (BP), high-pass (HP), all-pass (AP), and low-pass and high-pass with notch (LPN and HPN) filters. The numbers associated with the filter type designations (e.g. LP, BP) refer to the number of $(1+z^{-1})$ terms and the number of $z^{-1}$ terms in the numerator N(z), respectively. Y is a gain constant.

TABLE I

| Generic Form | Numerator N(z) |
| --- | --- |
| LP20 (bilinear transform) | $Y(1 + z^{-1})^2$ |
| LP11 | $Yz^{-1}(1 + z^{-1})$ |
| LP10 | $Y(1 + z^{-1})$ |
| LP02 | $Yz^{-2}$ |
| LP01 | $Yz^{-1}$ |
| LP00 | $Y$ |
| BP10 (bilinear transform) | $Y(1 - z^{-1})(1 + z^{-1})$ |
| BP01 | $Yz^{-1}(1 - z^{-1})$ |
| BP00 | $Y(1 - z^{-1})$ |
| HP | $Y(1 - z^{-1})^2$ |
| LPN | $Y(1 + \epsilon z^{-1} + z^{-2}), \epsilon > \alpha/\sqrt{\beta}, \beta > 0$ |
| HPN | $Y(1 + \epsilon z^{-1} + z^{-2}), \epsilon < \alpha/\sqrt{\beta}, \beta > 0$ |
| AP | $Y(\beta + \alpha z^{-1} + z^{-2})$ |
| GENERAL | $\gamma + \epsilon z^{-1} + \sigma z^{-2}$ |

Table II gives the zero placement formulae for the $T_{56E}$ transfer function. In particular, it lists the filter type, the design equations to obtain the zeros of the transfer function numerator N(z), and one solution. For the $T_{56F}$ transfer function, the solutions are of the same form except G, H, I and J are increased by the factor $(1+F)$.

TABLE II

| FILTER TYPE | DESIGN EQUATIONS | SIMPLE SOLUTION |
| --- | --- | --- |
| LP20 | $I = \|Y\|$<br>$G - I - J = 2\|Y\|$<br>$J - H = \|Y\|$ | $I = J = \|Y\|$<br>$G = 4\|Y\|, H = 0$ |
| LP11 | $I = 0, J = \|Y\|$<br>$G - I - J = \pm\|Y\|$<br>$J - H = \pm\|Y\|$ | $I = 0, J = \|Y\|$<br>$G = 2\|Y\|, H = 0$ |
| LP10 | $I = \|Y\|$<br>$G - I - J = \|Y\|$<br>$J - H = 0$ | $I = \|Y\|, J = 0$<br>$G = 2\|Y\|, H = 0$ |
| LP02 | $I = 0$<br>$G - I - J = 0$<br>$J - H = \pm\|Y\|$ | $I = J = 0$<br>$G = 0, H = \|Y\|$ |
| LP01 | $I = 0$<br>$G - I - J = \pm\|Y\|$<br>$J - H = 0$ | $I = J = 0$<br>$G = \|Y\|, H = 0$ |
| LP00 | $I = \|Y\|$<br>$G - I - J = 0$<br>$J - H = 0$ | $I = \|Y\|, J = 0$<br>$G = \|Y\|, H = 0$ |

TABLE II-continued

| FILTER TYPE | DESIGN EQUATIONS | SIMPLE SOLUTION |
|---|---|---|
| BP10 | $I = \|Y\|$ <br> $G - I - J = 0$ <br> $J - H = -\|Y\|$ | $I = \|Y\|, J = 0$ <br> $G = H = \|Y\|$ |
| BP01 | $I = 0$ <br> $G - I - J = \pm \|Y\|$ <br> $J - H = \mp \|Y\|$ | $I = 0, J = \|Y\|$ <br> $G = H = 0$ |
| BP00 | $I = \|Y\|$ <br> $G - I - J = -\|Y\|$ <br> $J - H = 0$ | $I = \|Y\|, J = 0$ <br> $G = H = 0$ |
| HP | $I = \|Y\|$ <br> $G - I - J = -2\|Y\|$ <br> $J - H = \|Y\|$ | $I = J = \|Y\|$ <br> $G = H = 0$ |
| HPN and LPN | $I = \|Y\|$ <br> $G - I - J = \|Y\|\epsilon$ <br> $J - H = \|Y\|$ | $I = J = \|Y\|$ <br> $G = \|Y\|(2+\epsilon), H = 0$ |
| | $I = \|Y\|\beta$ | $I = \|Y\|\beta, J = \|Y\|$ |
| AP ($\beta > 0$) | $G - I - J = \|Y\|\alpha$ <br> $J - H = \|Y\|$ <br> $I = \gamma$ | $G = \|Y\|(1+\beta+\alpha)$ <br> $H = 0$ <br> $I = \gamma$ |
| GENERAL ($\gamma > 0$) | $G - I - J = \epsilon$ <br> $J - H = \delta$ | $J = \delta + x$ <br> $G = \gamma + \delta + \epsilon + x$ <br> $H = x \geq 0$ |

Tables III and IV show the zero placement for the various $T_{53E}$ and $T_{53F}$ transfer functions, respectively.

TABLE III

| FILTER TYPE | DESIGN EQUATIONS | SIMPLE SOLUTION |
|---|---|---|
| LP20 | $IC + IE - G = \pm \|Y\|$ <br> $H + G - JC - JE - IE = \pm 2\|Y\|$ <br> $EJ - H = \pm \|Y\|$ | $I = \dfrac{\|Y\|(4E + C)}{EC}, J = \dfrac{\|Y\|}{E}$ <br> $G = \dfrac{\|Y\|(2E + C)^2}{EC}, H = 0$ |
| LP11 | $IC + IE - G = 0$ <br> $H + G - JC - JE - IE = \pm \|Y\|$ <br> $EJ - H = \pm \|Y\|$ | $I = \dfrac{\|Y\|(2E + C)}{EC}, J = \dfrac{\|Y\|}{E}$ <br> $G = \dfrac{\|Y\|(E + C)(2E + C)}{EC}, H = 0$ |
| LP10 | $IC + IE - G = \pm \|Y\|$ <br> $H + G - JC - JE - IE = \pm \|Y\|$ <br> $EJ - H = 0$ | $I = \dfrac{2\|Y\|}{C}, J = 0$ <br> $G = \dfrac{\|Y\|(E + C)^2}{EC}, H = 0$ |
| LP02 | $IC + IE - G = 0$ <br> $H + G - JC - JE - IE = 0$ <br> $EJ - H = \pm \|Y\|$ | $I = \dfrac{\|Y\|(E + C)}{EC}, J = \dfrac{\|Y\|}{E}$ <br> $G = \dfrac{\|Y\|(E + C)^2}{EC}, H = 0$ |
| LP01 | $IC + IE - G = 0$ <br> $H + G - JC - JE - IE = \pm Y$ <br> $EJ - H = 0$ | $I = \dfrac{\|Y\|}{C}, J = 0$ <br> $G = \dfrac{\|Y\|(E + C)}{C}, H = 0$ |
| LP00 | $IC + IE - G = \pm \|Y\|$ <br> $H + G - JC - JE - IE = 0$ <br> $EJ - H = 0$ | $I = \dfrac{\|Y\|}{C}, J = 0$ <br> $G = \dfrac{\|Y\| E}{C}, H = 0$ |
| BP10 | $IC + IE - G = \pm \|Y\|$ <br> $H + G - JC - JE - IE = 0$ <br> $EJ - H = \mp \|Y\|$ | $I = J = \dfrac{\|Y\|}{E}$ <br> $G = \dfrac{\|Y\|(2E + C)}{E}, H = 0$ |
| BP01 | $IC + IE - G = 0$ <br> $H + G - JC - JE - IE = \pm \|Y\|$ <br> $EJ - H = \mp \|Y\|$ | $I = J = 0$ <br> $G = 0, H = \|Y\|$ |
| BP00 | $IC + IE - G = \pm \|Y\|$ <br> $H + G - JC - JE - IE = \mp \|Y\|$ <br> $EJ - H = 0$ | $I = J = 0$ <br> $G = \|Y\|, H = 0$ |
| HP | $IC + IE - G = \pm \|Y\|$ <br> $H + G - JC - JE - IE = \mp 2\|Y\|$ <br> $EJ - H = \pm \|Y\|$ | $I = J = 0$ <br> $G = H = \|Y\|$ |
| HPN and LPN | $IC + IE - G = \pm \|Y\|$ <br> $H + G - JC - JE - IE = \pm \|Y\|\epsilon$ <br> $EJ - H = \pm \|Y\|$ | see general solution below |
| AP | $IC + IE - G = \pm \|Y\|\beta$ <br> $H + G - JC - JE - IE = \pm \|Y\|\alpha$ <br> $EJ - H = \pm \|Y\|$ | see general solution below |
| GENERAL $\sigma > 0$ | $IC + IE - G = \gamma$ <br> $H + G - JC - JE - IE = \epsilon$ | $I = \dfrac{\gamma + \sigma + \epsilon}{C} + \dfrac{\sigma}{E}, J = \dfrac{\sigma}{E}$ <br> $G = I(C + E) - \gamma, H = 0$ |

TABLE III-continued

| FILTER TYPE | DESIGN EQUATIONS | SIMPLE SOLUTION |
|---|---|---|
| | $EJ - H = \sigma$ | |

TABLE IV

| FILTER TYPE | DESIGN EQUATIONS | SIMPLE SOLUTION |
|---|---|---|
| | $GF + G - IC = \|Y\|(1 + F)$ | $I = 0, J = \dfrac{\|Y\|(2 + F)^2}{C}$ |
| LP20 | $JC - FH - H - G = 2\|Y\|(1 + F)$<br>$H = \|Y\|(1 + F)$<br>$GF + G - IC = 0$ | $G = \|Y\|, H = \|Y\|(1 + F)$ |
| LP11 | $JC - FH - H - G = \|Y\|(1 + F)$<br>$H = \|Y\|(1 + F)$<br>$GF + G - IC = \pm \|Y\|(1 + F)$ | $I = 0, J = \dfrac{\|Y\|(1 + F)(2 + F)}{C}$<br>$G = 0, H = \|Y\|(1 + F)$ |
| LP10 | $JC - FH - H - G = \pm \|Y\|(1 + F)$<br>$H = 0$<br>$GF + G - IC = 0$ | $I = 0, J = \dfrac{\|Y\|(2 + F)}{C}$<br>$G = Y, H = 0$ |
| LP02 | $JC - FH - H - G = 0$<br>$H = \|Y\|(1 + F)$<br>$GF + G - IC = 0$ | $I = 0, J = \dfrac{\|Y\|(1 + F)^2}{C}$<br>$G = 0, H = \|Y\|(1 + F)$ |
| LP01 | $JC - FH - H - G = \pm \|Y\|(1 + F)$<br>$H = 0$<br>$GF + G - IC = \pm \|Y\|(1 + F)$ | $I = 0, J = \dfrac{\|Y\|(1 + F)}{C}$<br>$G = 0, H = 0$ |
| LP00 | $JC - FH - H - G = 0$<br>$H = 0$<br>$GF + G - IC = -\|Y\|(1 + F)$ | $I = \dfrac{\|Y\|(1 + F)}{C}, J = 0$<br>$G = 0, H = 0$ |
| BP10 | $JC - FH - H - G = 0$<br>$H = \|Y\|(1 + F)$<br>$GF + G - IC = 0$ | $I = \dfrac{\|Y\|(1 + F)}{C}, J = \dfrac{\|Y\|(1 + F)^2}{C}$<br>$G = 0, H = \|Y\|(1 + F)$ |
| BP01 | $JC - FH - H - G = -\|Y\|(1 + F)$<br>$H = \|Y\|(1 + F)$<br>$GF + G - IC = \pm \|Y\|(1 + F)$ | $I = 0, J = \dfrac{\|Y\| F(1 + F)}{C}$<br>$G = 0, H = \|Y\|(1 + F)$ |
| BP00 | $JC - FH - H - G = \mp \|Y\|(1 + F)$<br>$H = 0$<br>$GF + G - IC = \|Y\|(1 + F)$ | $I = J = \dfrac{\|Y\|(1 + F)}{C}$<br>$G = H = 0$ |
| HP | $JC - FH - H - G = -2\|Y\|(1 + F)$<br>$H = \|Y\|(1 + F)$ | $I = 0, J = \dfrac{\|Y\| F^2}{C}$<br>$G = \|Y\|, H = \|Y\|(1 + F)$ |
| HPN and LPN | $GF + G - IC = \|Y\|(1 + F)$<br>$JC - FH - H - G = -\|Y\|\epsilon(1 + F)$<br>$H = \|Y\|(1 + F)$ | see general solution below |
| AP | $GF + G - IC = \|Y\|\beta(1 + F)$<br>$JC - FH - H - G = \|Y\|\alpha(1 + F)$<br>$H = \|Y\|(1 + F)$ | see general solution below |
| GENERAL $\delta > 0$ | $GF + G - IC = \gamma(1 + F)$<br>$JC - FH - H - G = \epsilon(1 + F)$<br>$H = \delta(1 + F)$ | $I = x \geq 0$<br>$J = \dfrac{\delta(1 + F)^2 + \epsilon(1 + F) + \gamma}{C} + \dfrac{x}{1 + F}$<br>$G = \gamma + \dfrac{C}{1 + F} x$<br>$H = \delta(1 + F)$ |

It will be noted that if the "simple" solutions given in the several tables do not satisfy a particular set of requirements, there are in each case other possible solutions that also satisfy the design equations.

Figure 4:
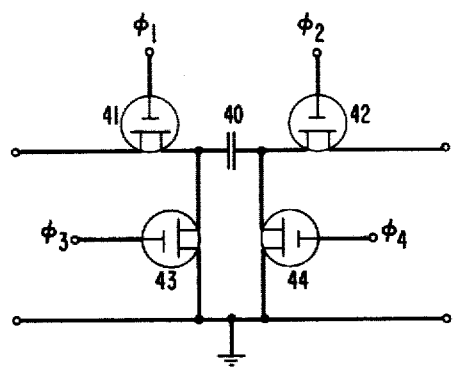
FIG. 4 shows an embodiment of a switched-capacitor circuit.

FIG. 4 is an illustrative embodiment of a switched capacitor circuit employing field effect transistors (FETs) as switches. The circuit comprises the series connection of a first transistor 41, a capacitor 40, and a second transistor 42. A third transistor 43 is connected between the junction of transistor 41 and one terminal of capacitor 40, and signal ground. A fourth transistor 44 is connected between the junction of transistor 42 and the other terminal of capacitor 40, and signal ground.

In operation, timing signals $\phi_1$, $\phi_2$, $\phi_3$, and $\phi_4$, represent pulse trains applied to the gate electrodes of the respective transistors. To obtain through switching, $\phi_1 = \phi_2$ and $\phi_3 = \phi_4$ where $\phi_1$ and $\phi_3$ are nonoverlapping pulse trains. To obtain diagonal switching, $\phi_1 = \phi_3$ and $\phi_2 = \phi_4$ where $\phi_1$ and $\phi_2$ are nonoverlapping pulse trains. As explained in the copending application by P. E. Fleischer, Ser. No. 95663, filed Nov. 19, 1979, the illustrative switching circuit has the advantage of being parasitic free.

As indicated hereinabove, it is an advantage of the present invention that it simplifies the fabrication of customized filters. Using the double-poly MOS process, the switches and amplifiers, shared in common by all the filter configuration, can be integrated onto each chip. Using the minimum switch configuration of FIG. 2, this would include six switches and the two operational amplifiers. To produce a particular filter configuration involves custom designing the two poly masks which define the capacitors and the circuit interconnections. Because all designs share the common basic chip design, the resulting cost of a particular filter circuit is correspondingly reduced.

We claim:

1. A switched-capacitor active filter comprising:
    first and second operational amplifiers (10, 11), each having an inverting input port (1, 1'), a noninverting input port (2, 2'), and an output port (3, 3');
    a diagonally-switched capacitor (A) connecting the output port (3) of the first amplifier (10) to the inverting input port (1') of the second amplifier (11);
    an unswitched feedback capacitor (D) connected between the output port (3) of the first amplifier (10) and the inverting input port (1) of the first amplifier (10);
    an unswitched feedback capacitor (B) connected between the output port (3') of the second amplifier (11) and the inverting input port (1') of the second amplifier (11);
    a through-switched capacitor (C) connected between the output port (3) of the second amplifier (11) and the inverting input port (1) of the first amplifier (10);
    input circuit means for coupling an input terminal (5) of the filter to the inverting input port (1, 1') of at least one of the first and second amplifiers (10, 11); and
    damping means (E, F).

2. The filter in accordance with claim 1 wherein the damping means comprises a damping capacitor (E, F) connected between the output port (3') of the second amplifier (11) and the inverting input port (1, 1') of at least one of the first and second amplifiers (10, 11).

3. The filter in accordance with claim 2 wherein the damping capacitor is an unswitched capacitor (E) connected to the inverting input port (1) of the first amplifier (10).

4. The filter in accordance with claim 3 wherein the damping capacitor is a through-switched capacitor (F) connected to the inverting input port (1') of the second amplifier (11).

5. The filter in accordance with claim 1 wherein the input circuit means comprises a first input circuit for coupling the input terminal (5) to the inverting input port (1) of the first amplifier (10) and a second input circuit for coupling the input terminal (5) to the inverting input port (1') of the second amplifier (11).

6. The filter in accordance with claim 5 wherein the first input circuit comprises, mutually connected in parallel, at least one capacitor chosen from the group consisting of:
    an unswitched capacitor (L);
    a through-switched capacitor (G); and
    a diagonally-switched capacitor (H).

7. The filter in accordance with claim 6 wherein the second input circuit comprises, mutually connected in parallel, at least one capacitor chosen from the group consisting of:
    an unswitched capacitor (K);
    a through-switched capacitor (I); and
    a diagonally-switched capacitor (J).

8. The filter in accordance with claim 7 wherein the damping means comprises a damping capacitor (E, F) connected between the output port (3') of the second amplifier and the inverting input port (1, 1') of at least one of the first and second amplifiers (10, 11).

9. The filter in accordance with claim 8 wherein the damping capacitor is a through-switched capacitor (F) connected to the inverting input port (1') of the second amplifier (11).

10. The filter in accordance with claim 8 wherein the damping capacitor is an unswitched capacitor (E) connected to the inverting input port (1) of the first amplifier (10).

* * * * *